United States Patent [19]
Egley et al.

[11] Patent Number: 5,285,127
[45] Date of Patent: Feb. 8, 1994

[54] SINGLE MODE RESONATOR AND METHOD

[75] Inventors: Bert D. Egley, Tacoma, Wash.; Piyush K. Gupta, Antioch; G. Richard Newell, Alamo, both of Calif.

[73] Assignee: New SD, Inc., San Francisco, Calif.

[21] Appl. No.: 787,486

[22] Filed: Nov. 4, 1991

Related U.S. Application Data

[63] Continuation-in-part of Ser. No. 443,917, Nov. 30, 1989, abandoned.

[51] Int. Cl.$^5$ ............................................. H01L 41/08
[52] U.S. Cl. ..................................... 310/366; 310/321; 310/367; 310/370
[58] Field of Search ............... 310/360, 361, 365, 366, 310/370, 367, 312, 321, 323, 330-332

[56] References Cited

U.S. PATENT DOCUMENTS

| | | | |
|---|---|---|---|
| 1,977,169 | 10/1934 | Cady | 310/366 X |
| 3,946,257 | 3/1976 | Kawamura | 310/370 |
| 4,372,173 | 2/1983 | EerNisse et al. | 310/370 |
| 4,415,827 | 11/1983 | Chuang | 310/370 |
| 4,469,979 | 9/1984 | Chuang | 310/370 |
| 4,757,228 | 7/1988 | Kalinoski et al. | 310/366 X |
| 4,868,447 | 9/1989 | Lee | 310/365 X |
| 4,929,860 | 5/1990 | Hulsing, II et al. | 310/366 |

OTHER PUBLICATIONS

Söderkvist, A Mathematical Analysis of Flexural Vibrations of Piezoelectric Beams with Applications to Angular Rate Sensors, Uppsala University, pp. 27-43.

*Primary Examiner*—Mark O. Budd
*Attorney, Agent, or Firm*—Flehr, Hohbach, Test, Albritton & Herbert

[57] ABSTRACT

Mechanical resonator and method in which electrodes or other driving and sensing elements are energized with an AC voltage to produce oscillations in a tine. The electrodes or other driving and sensing elements have at least two parameters which are adjusted to selectively enhance oscillations in one mode, e.g. the fundamental mode, and/or to selectively suppress oscillations in one or more other modes, e.g. an overtone mode. The parameters which can be adjusted include the endpoints of electrodes, the width of a gap between adjacent ends of electrodes, and corresponding features of other driving and sensing elements.

11 Claims, 12 Drawing Sheets

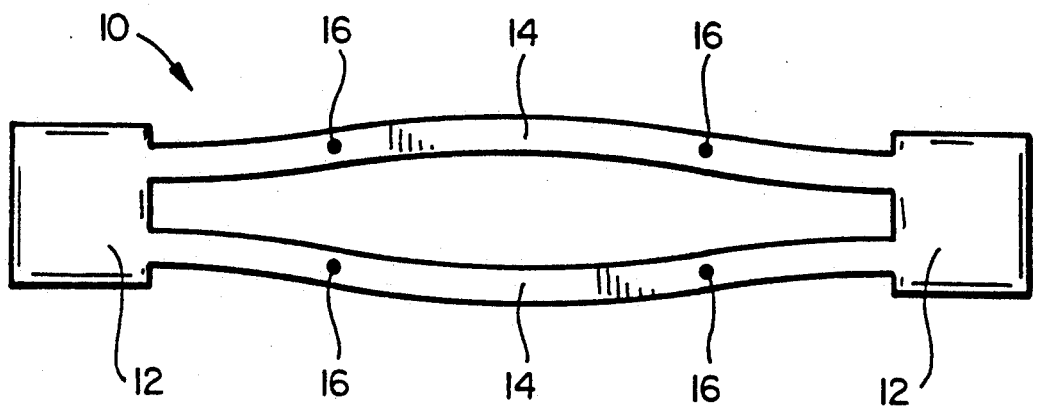
FIG_1
*(PRIOR ART)*
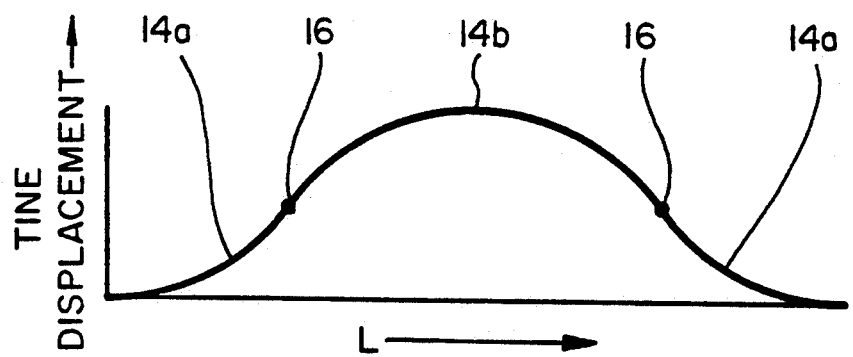
FIG_2
*(PRIOR ART)*

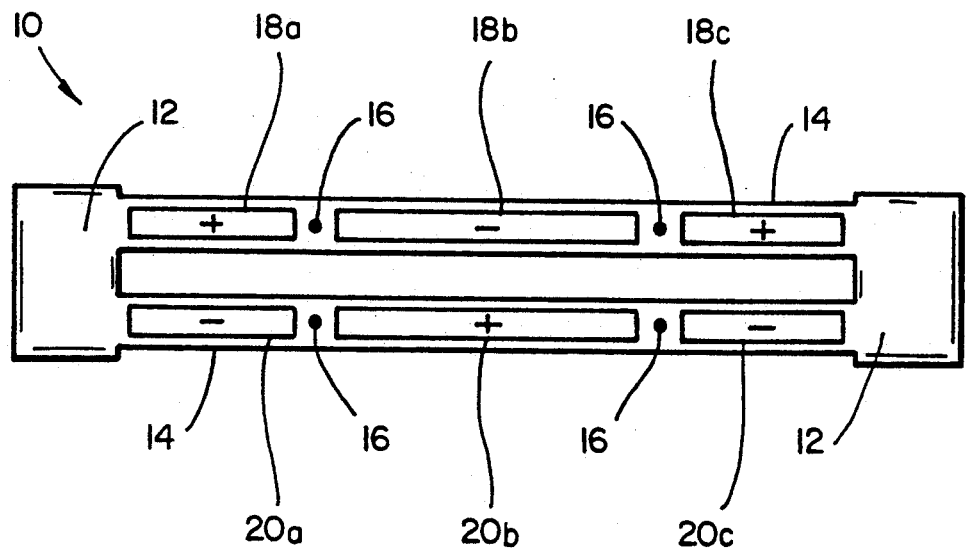
FIG_3
(PRIOR ART)
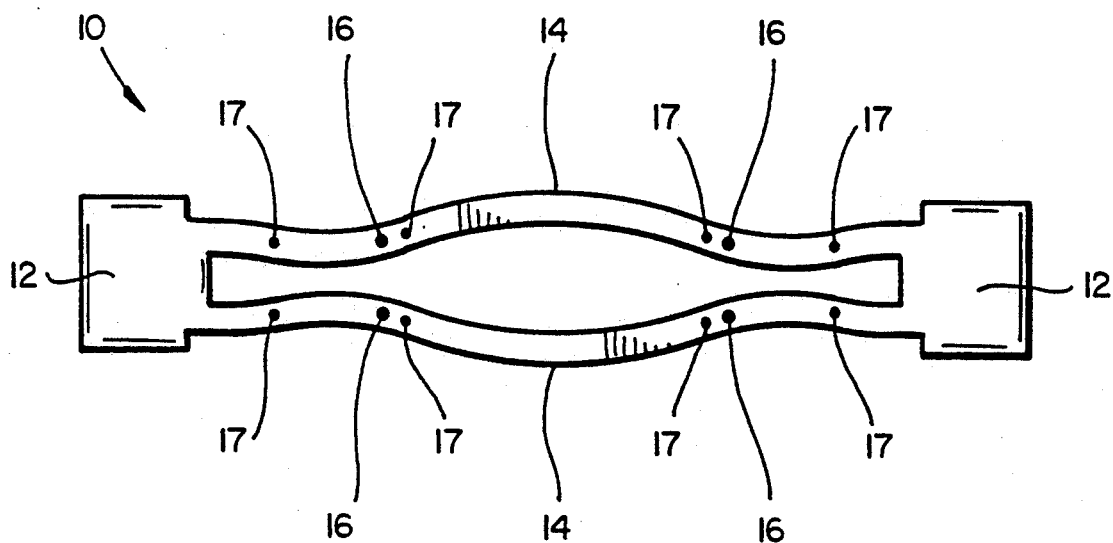
FIG_4
(PRIOR ART)

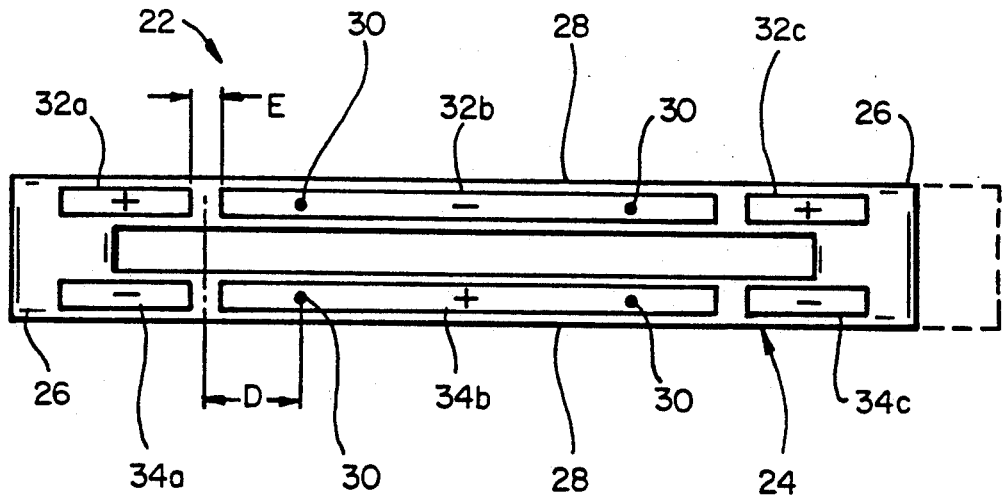
FIG_5
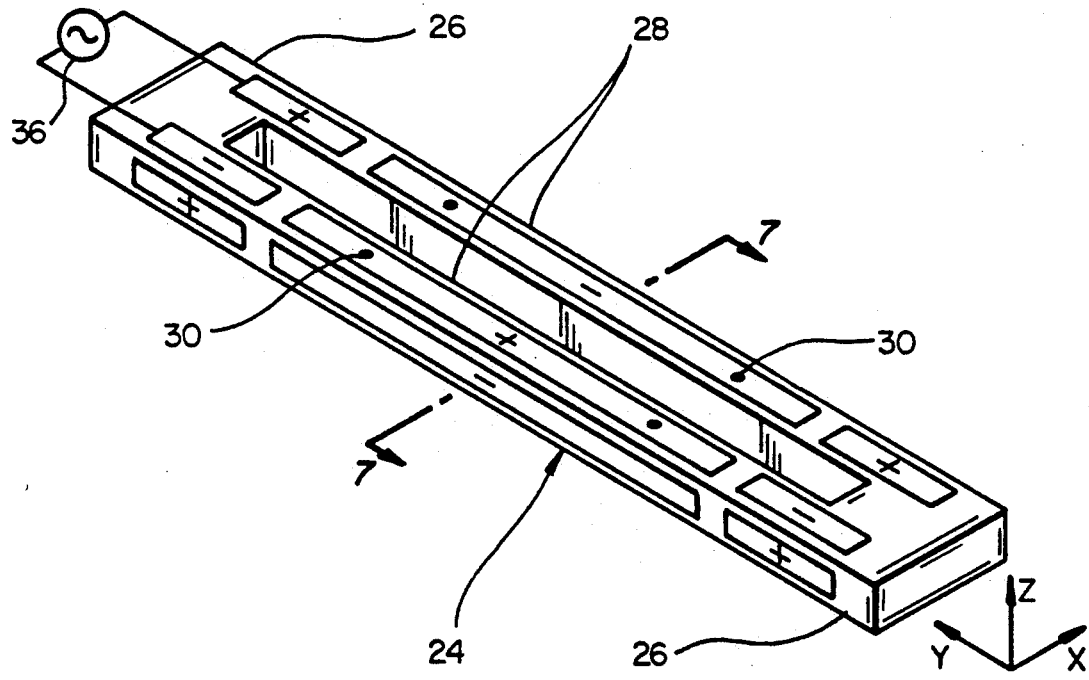
FIG_6

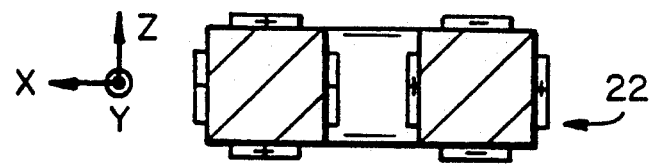
FIG_7
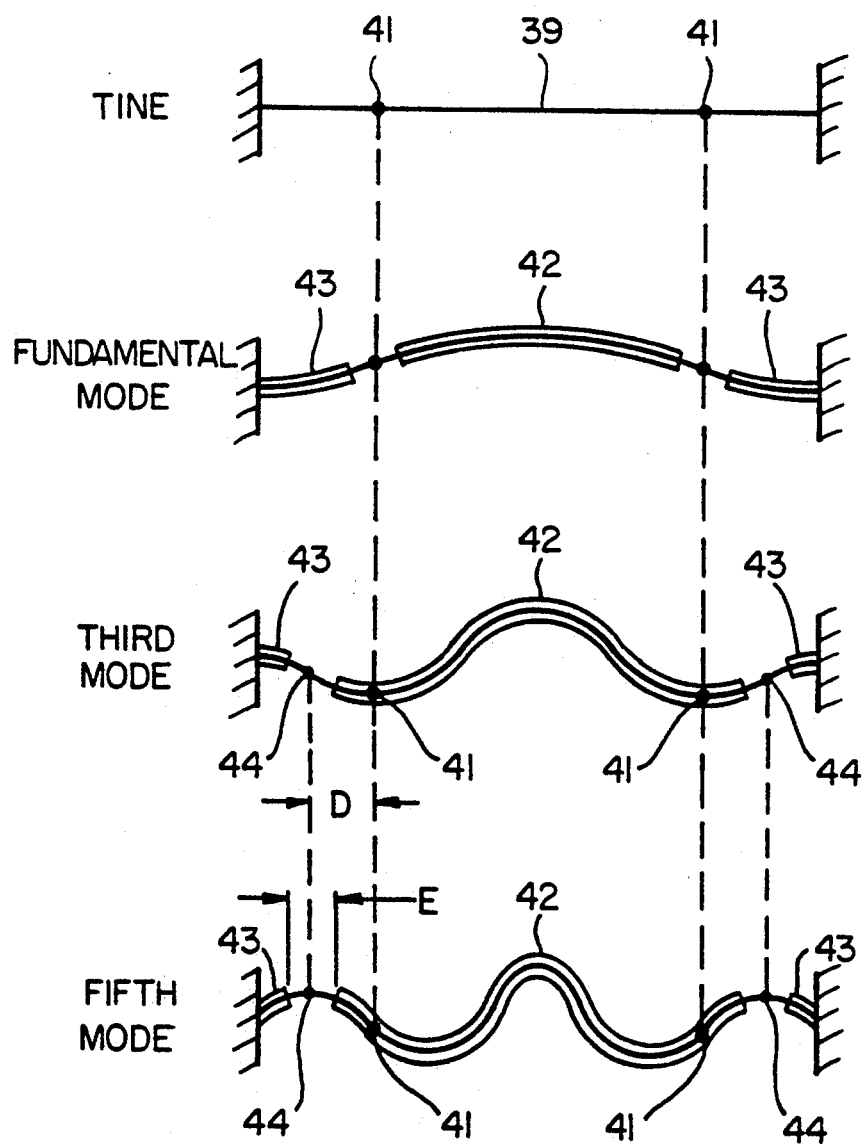
FIG_8

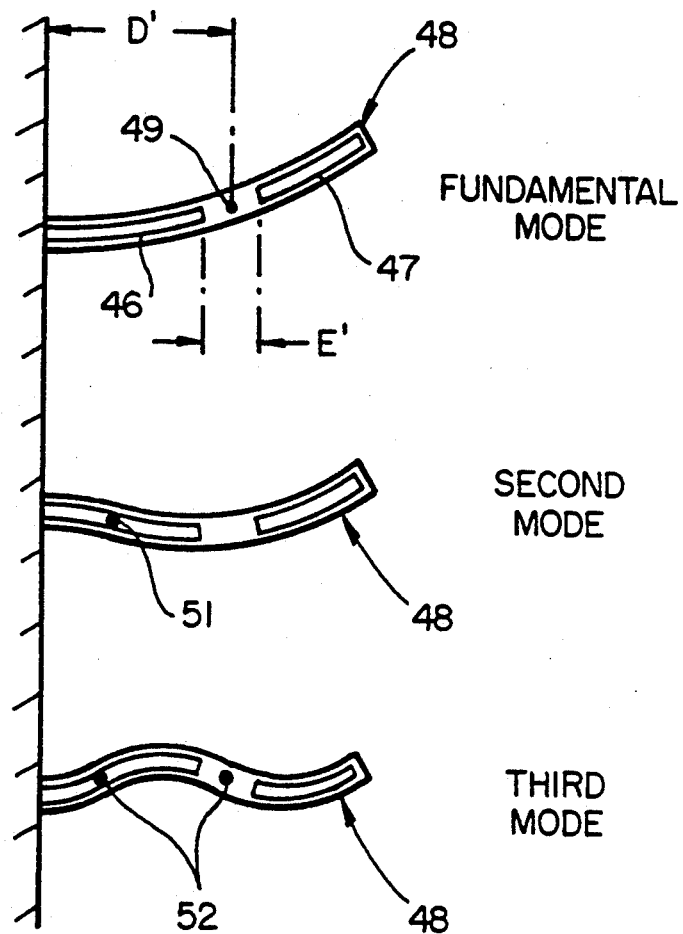
FIG_9
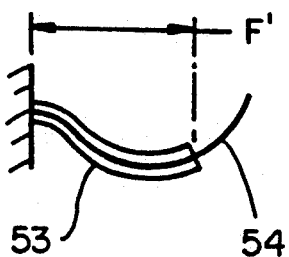
FIG_10
(PRIOR ART)

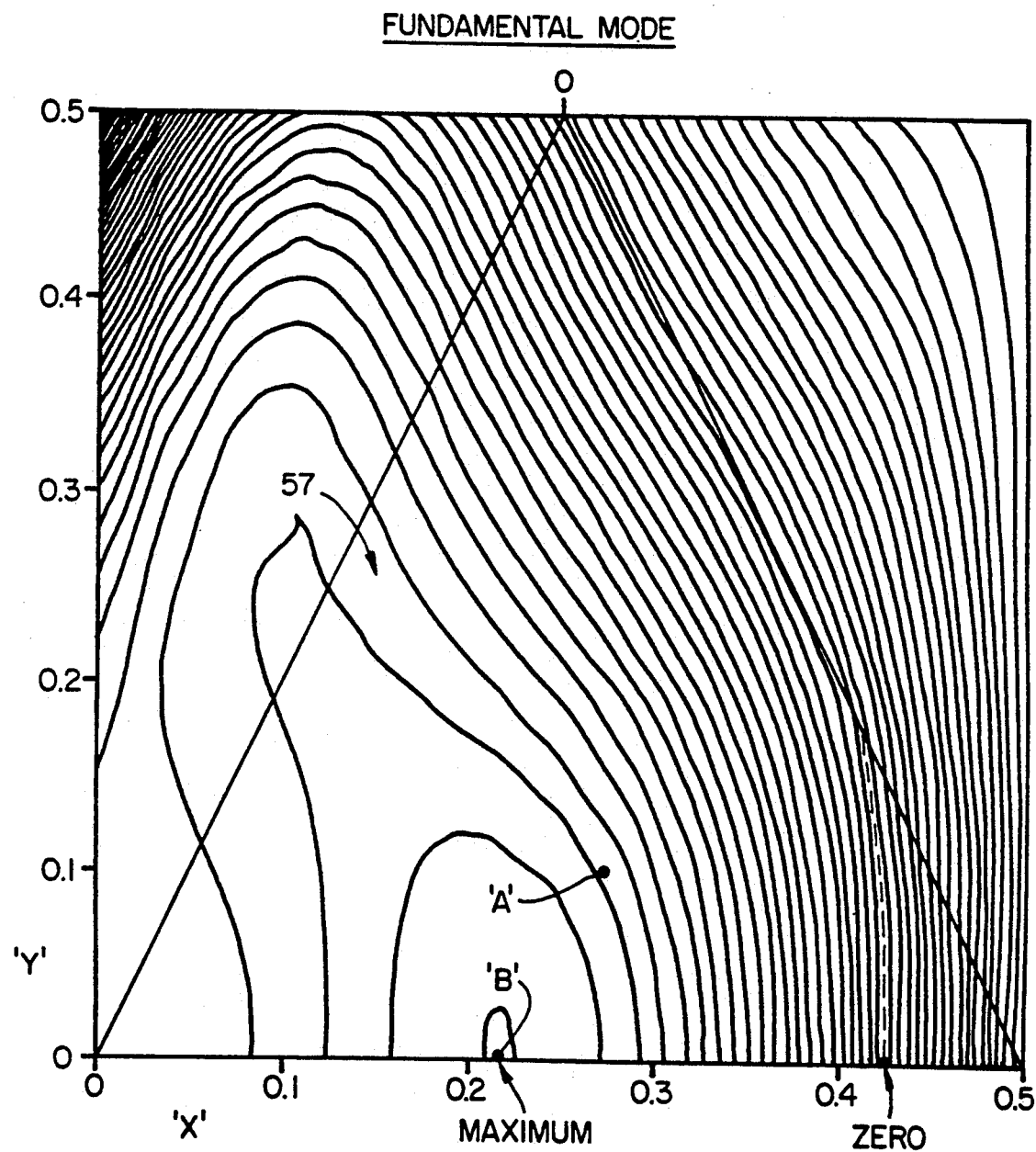
FIG_11a

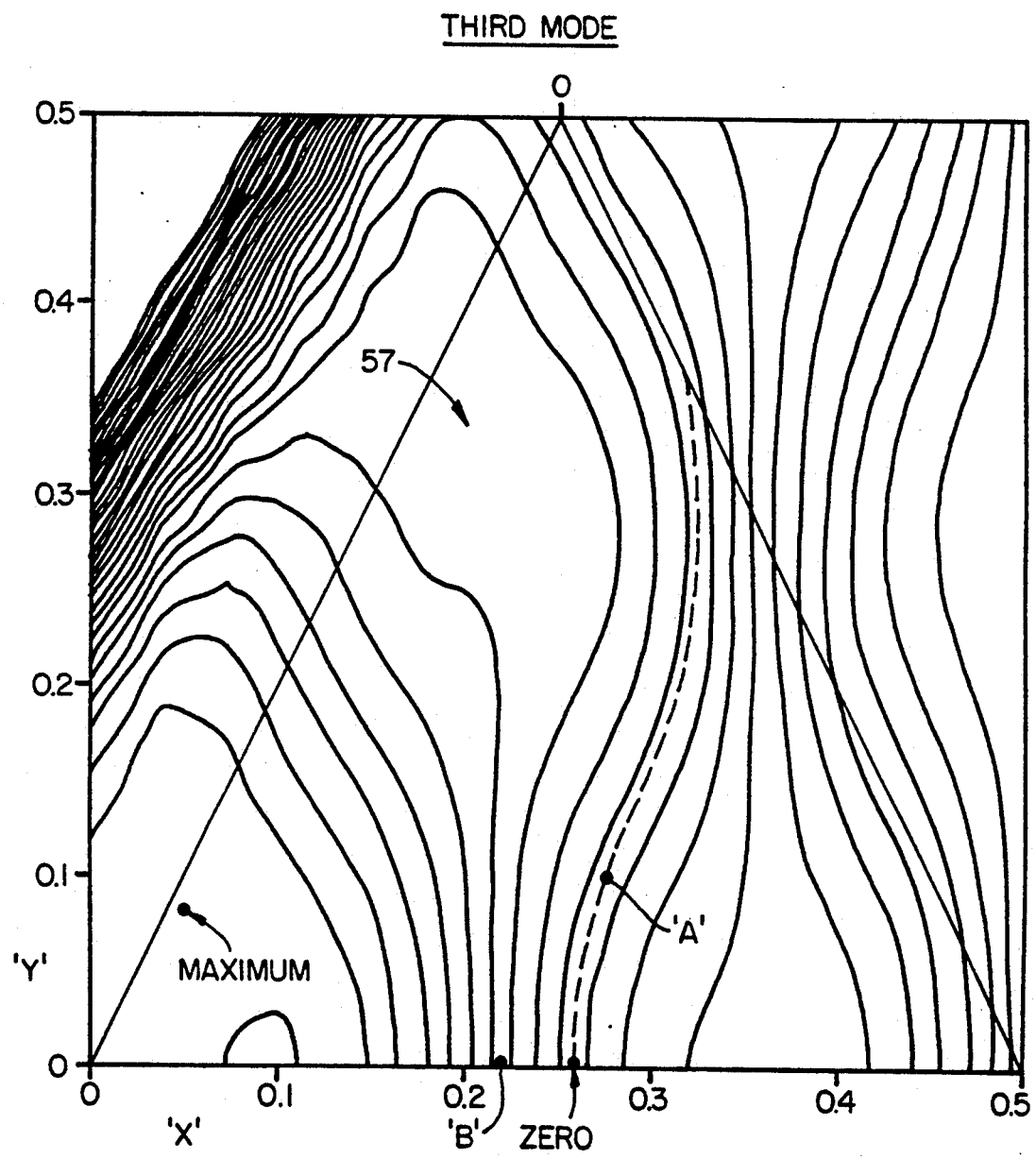
FIG_11b

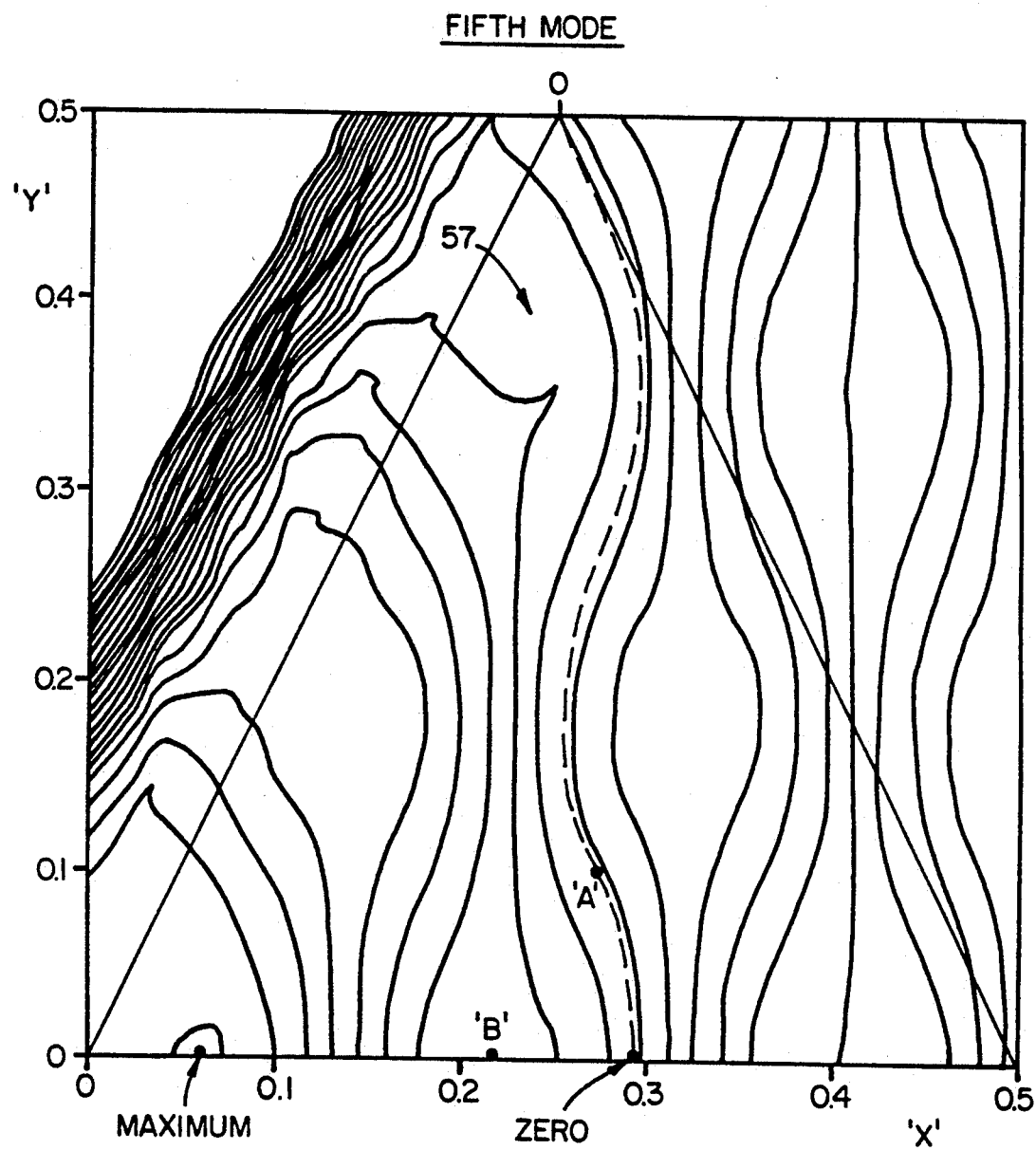
FIG_11c

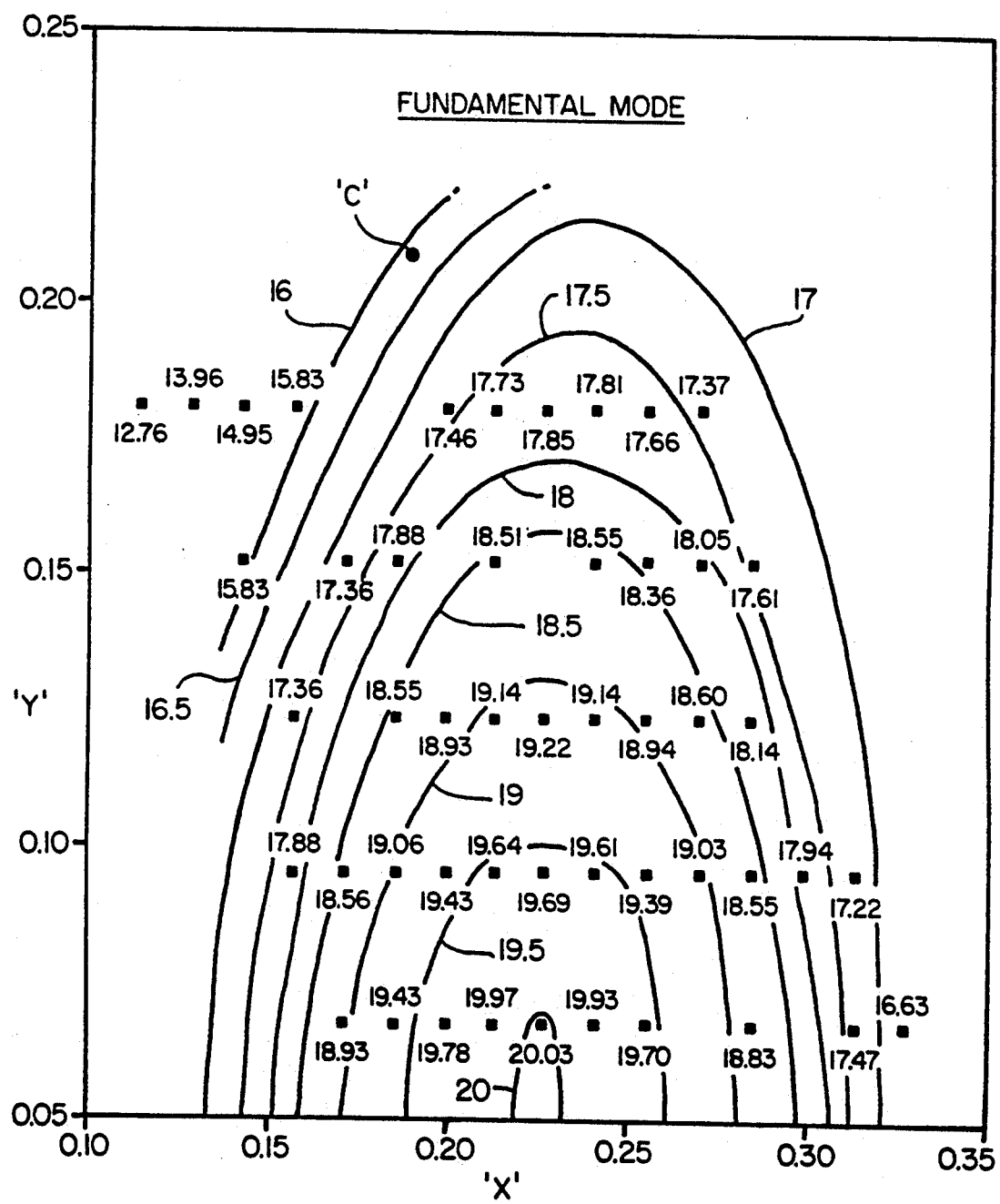
FIG_12a

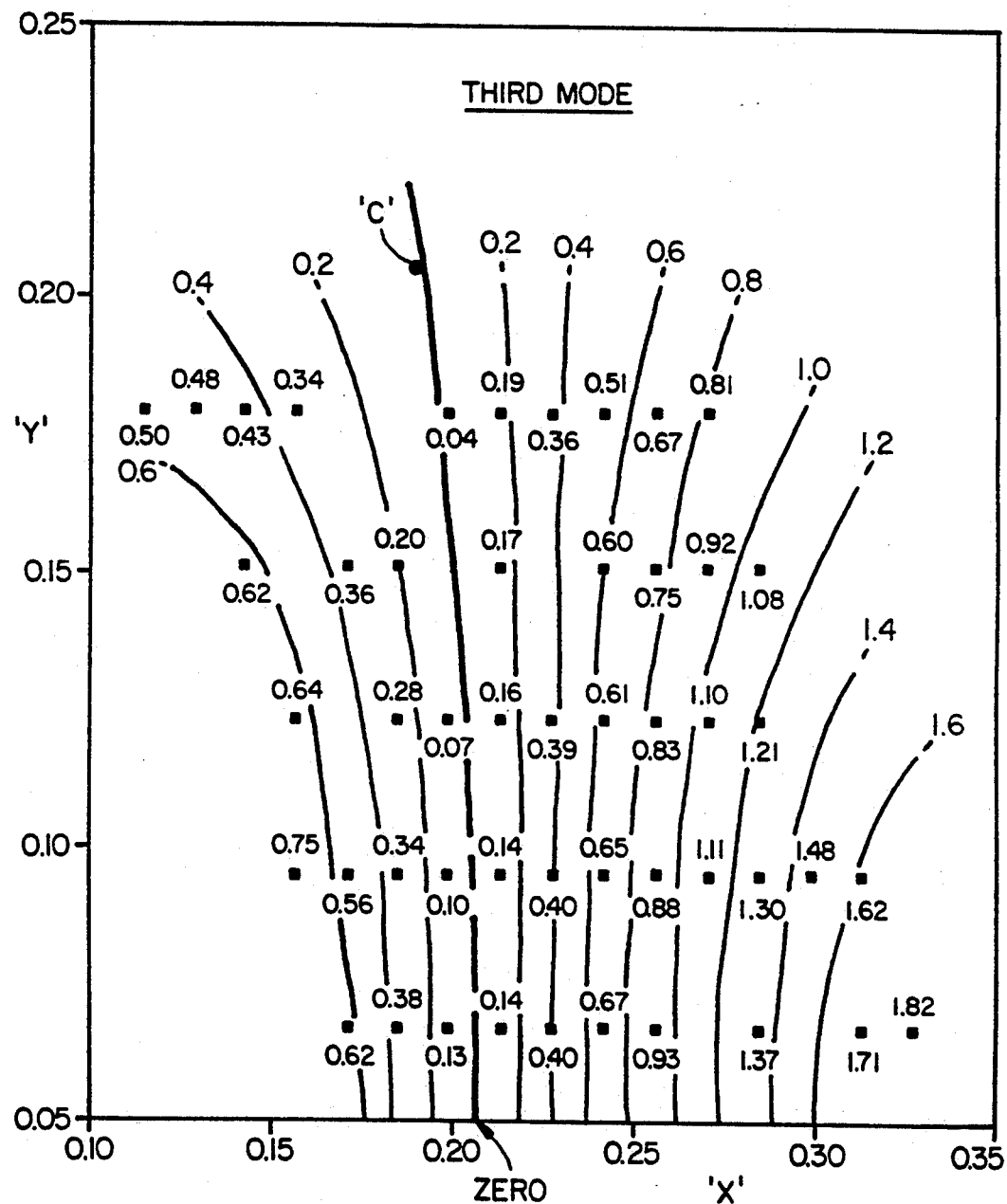
FIG_12b

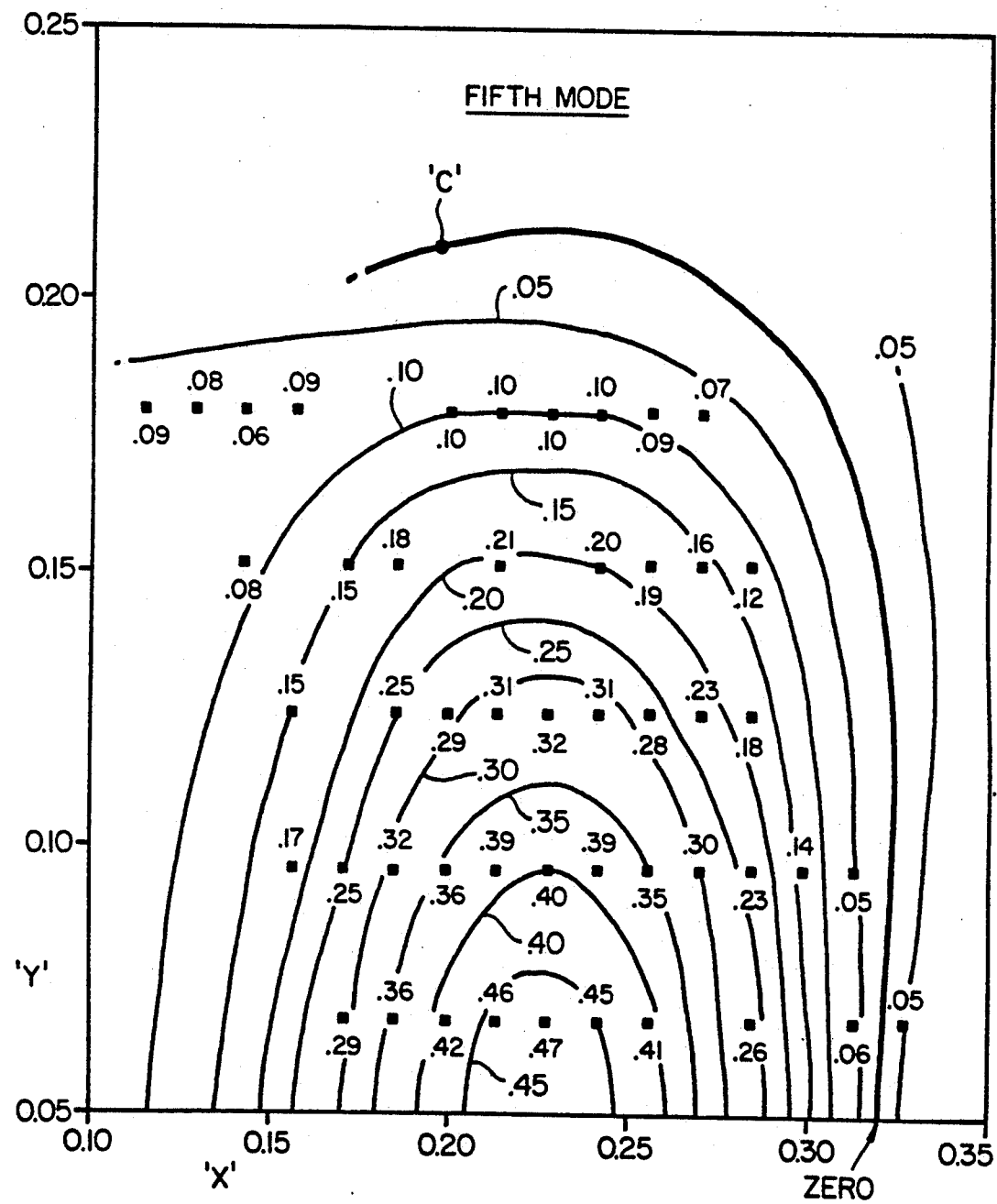
FIG_12c

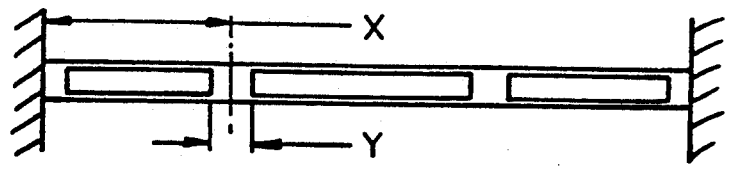
FIG_11d
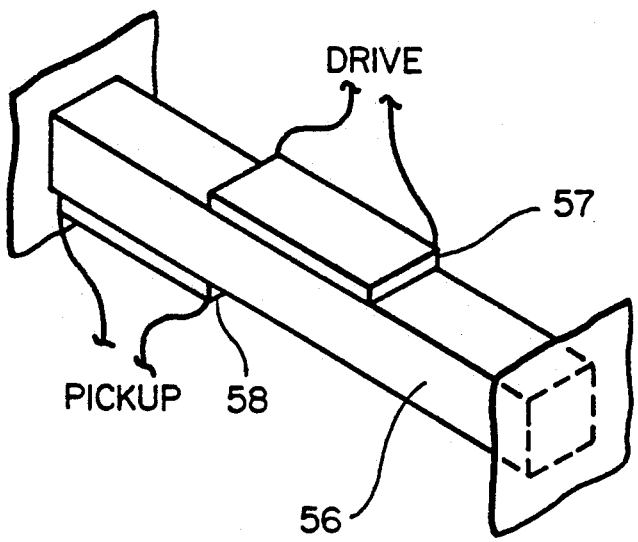
FIG_13
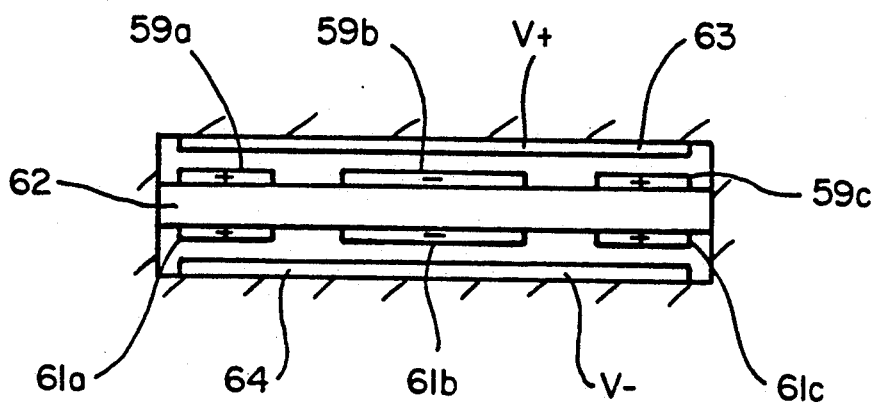
FIG_14

SINGLE MODE RESONATOR AND METHOD

This is a continuation-in-part of Ser. No. 07/443,917, filed Nov. 30, 1989, now abandoned, in the name of Bert D. Egley.

This invention pertains generally to mechanical resonators and, more particularly, to a resonator and method for producing oscillations in a desired mode.

Mechanical resonators are used in many applications because of the high quality factors and, hence, frequency selectivity which can be achieved with them. A few such applications include frequency references, or timepieces, frequency selective filters, force or displacement sensors, coriolis inertial rate sensors, and temperature, flow, viscosity sensors and other sensing applications. Devices such as resonator force sensors may, in turn, be used in a variety of other applications such as weighing scales, accelerometers or pressure sensors.

For many of these applications, the mechanical resonator is connected in series with and is driven by an electronic oscillator circuit which senses the mechanical motion of the resonator and excites it electrically in a closed feedback loop. One such oscillator circuit is shown in U.S. Pat. No. 5,047,734. In such a system, the resonator provides the primary frequency selectivity, and a single mechanical mode is chosen to have a greater transmissibility than the others. For filtering applications, it is also usually desired that a single selected mode have a significantly higher transmissibility than the other modes.

A mechanical resonator can take many physical forms, including torsion rods with dumbbell masses or flat disks, or one or more elongated tines or strings, with the elongated tines being of particular interest. The resonator structure itself is usually made of a good spring material such as steel, beryllium copper, or crystals such as quartz or lithium niobate which exhibit a piezoelectric property. Such crystals are especially attractive in that the piezoelectric property facilitates coupling to an electronic circuit such as an oscillator or filter.

With a mechanical resonator, a single pair of electrodes can be utilized to provide both the drive and the pick-up, with the drive being provided by a voltage impressed between the electrodes, and the pick-up being provided by sensing a current through the electrodes. A number of different physical effects can be utilized in providing the drive and pick-up, the most common being the piezoelectric effect, electrostatic effects, and electromagnetic effects, although other effects are sometimes used for the drive and/or the pick-up.

The drive and pick-up means may be common, as in the case of a quartz crystal resonator with a single pair of electrodes, or they may be separate as in the case of separate sets of electrodes for the drive and the pick-up. Another example of separate means would be a ferromagnetic tuning fork excited by electromagnets, with piezoresistive strain gauges for monitoring the resulting motion.

Mechanical resonators are well known in the art. One example of a quartz crystal resonator is disclosed in U.S. Pat. No. 4,469,979 and illustrated in FIG. 1. This resonator, which is designated by the reference numeral 10, has a Z-cut crystal orientation and includes opposite end portions 12 and a pair of laterally spaced apart tines 14 extending lengthwise between end portions 12. As described in detail in U.S. Pat. No. 4,469,979, each tine has two points 16 along its length where the second derivative of lateral displacement with respect to length changes in polarity when the tine is excited in its fundamental mode. This change in polarity is graphically illustrated in FIG. 2 which depicts exaggerated lateral displacement of one of the tines along its length at a given instant in time. Note that the tine is concave (as viewed from outside the tine) along opposite end sections 14a and convex along a central section 14b. The junctions between the concave and convex sections occur at points 16 where the second derivative of lateral displacement with respect to length changes polarity. For purposes of convenience, each point 16 will be referred to hereinafter as an inflection point.

The resonator disclosed in U.S. Pat. No. 4,469,979 also includes a set of electrodes mounted lengthwise in adjacent end-to-end relationship to one another on each of the lengthwise surfaces of each tine 14 so as to cause the tines to oscillate a specific way when the electrodes are energized with an AC voltage. Two sets of electrodes are illustrated in FIG. 3 at 18a-c and 20a-c. Note specifically that the adjacent ends of adjacent electrodes in each set are located on opposite sides of and in close proximity to inflection points 16. This is true for all of the sets of electrodes mounted on tines 14. The electrodes are energized with an AC voltage which is applied to the electrodes of each set with alternating polarity. This is depicted diagrammatically at a given instant of time by means of the plus (+) and minus (−) signs in FIG. 3. Note from FIG. 3 that the polarities of the voltages applied to the electrodes in each set change at the inflection points 16 along the length of each tine. This, according to U.S. Pat. No. 4,469,979, causes each of the tines 14 to vibrate in its fundamental mode shown in FIG. 1. For purposes of clarity, the electrodes themselves have been omitted from FIG. 1.

It has been found that when quartz crystal resonators are constructed in accordance with the teachings discussed above and connected to an oscillator circuit, the tines do, indeed, sometimes oscillate in the fundamental mode. However, at the same time, it was found that the tines oscillate randomly between this mode and a much higher frequency overtone mode with different inflection points 17 (four per tine), as illustrated in FIG. 4. This makes it impossible to use the resonator reliably in a timepiece, an accelerometer or in a transducer generally. Such devices require a vibrating tine or tines which oscillate in a consistent, predictable mode. Similarly, in a filter, too much response at one or more undesired modes can degrade the desired frequency selectivity of the filter and make the resonator unsuitable for use in the filter.

U.S. Pat. No. 4,372,173 discloses a technique for preventing spurious vibrating modes in a resonator type force transducer by the use of a very specific relationship between the length, width and thickness of each tine. This is said to reduce the likelihood of buckling when the transducer is subjected to compressive forces as well as preventing the tines from oscillating in certain spurious modes.

The resonators shown in U.S. Pat. Nos. 4,469,979 and 4,372,173 are double ended in that both ends of the tines are connected to end pieces, or fixed, as contrasted with single ended resonators or tuning forks having tines which are connected to a base at one end and are free to vibrate at the other. Heretofore, there have also been some attempts to promote certain desired modes of operation in such resonators by the sizing and positioning of electrodes thereon, and examples of these approaches are found in U.S. Pat. Nos. 3,946,257 and 4,415,827.

U.S. Pat. No. 3,946,257 discloses a quartz crystal vibrator for a timepiece having electrodes which are sized to offset higher harmonic oscillations in the tines of a single ended tuning fork and thereby produce oscillation at the fundamental frequency only. According to this technique the ratio of the length of each electrode to the effective length of the tine on which it is placed is selected to cancel the induced field due to deformation corresponding to second and higher harmonic oscillations so that the tine oscillates substantially only at the fundamental frequency when driven by an oscillator.

U.S. Pat. No. 4,415,827 teaches that for operation in a second overtone mode, the electrodes on the tines of a single ended tuning fork should change polarity at the points where the mechanical stresses change so that essentially no portion of the tine is simultaneously subjected to electrical and mechanical forces tending to deflect it in opposite directions. This is accomplished by providing breaks between the electrodes at the points where the stresses change, with the electrodes extending no more than 10 percent of the electrode length past the points at which the changes in stress occur.

A further discussion of electrode patterns and locations on piezoelectric beams, with specific reference to angular rate sensors is found in the doctoral dissertation of Jan Soderkwist, entitled "A Mathematical analysis of Flexural Vibrations of Piezoelectric Beams with Applications to Angular Rate Sensors" (Uppsala University, 1990). That analysis includes several electrode patterns for exciting vibrations in quartz crystal flexure resonators (page 26) and equations which compare the relative efficiencies of different electrode configurations, including those in which polarity changes at the inflection points (pages 36–42).

It is in general an object of the invention to provide a new and improved mechanical resonator and method for producing oscillations in a desired mode.

Another object of the invention is to provide a resonator and method of the above character which overcome the limitations and disadvantages of the resonators heretofore provided.

These and other objects are achieved in accordance with the invention by providing a mechanical resonator and method in which electrodes or other driving and sensing elements are energized with an AC voltage to produce oscillations in a tine. The electrodes or other driving and sensing elements have at least two parameters which are adjusted to selectively enhance oscillations in one mode, e.g. the fundamental mode, and/or to selectively suppress oscillations in one or more other modes, e.g. an overtone mode. The parameters which can be adjusted include the endpoints of electrodes, the width of a gap between adjacent ends of electrodes, and corresponding features of other driving and sensing elements.

FIG. 1 is a diagrammatic view of a quartz crystal resonator of the prior art, oscillating in its fundamental mode.

FIG. 2 is a graphical illustration of an operating characteristic of the prior art resonator of FIG. 1.

FIG. 3 is a diagrammatic view of the prior art resonator of FIG. 1, with its electrodes in place.

FIG. 4 is a diagrammatic view of the prior art resonator of FIG. 1, vibrating in an overtone mode.

FIG. 5 is a diagrammatic view of one embodiment of a quartz crystal resonator according to the invention.

FIG. 6 is an isometric view of the embodiment of FIG. 5.

FIG. 7 is a cross-sectional view taken generally along line 7—7 in FIG. 6.

FIG. 8 illustrates an embodiment of the invention having multiple degrees of freedom for enhancing and suppressing different modes of oscillation in one tine of a double ended resonator according to the invention.

FIG. 9 illustrates an embodiment of the invention having multiple degrees of freedom for enhancing and suppressing different modes of oscillation in one tine of a single ended resonator according to the invention.

FIG. 10 illustrates a prior art resonator having only a single degree of freedom for enhancing or suppressing oscillation in a given mode.

FIGS. 11a-c are a first set of contour plots showing the output coupling efficiency of electrodes for the first, third and fifth modes of a double ended tine which is illustrated diagrammatically in FIG. 11d.

FIGS. 12a-c illustrate the relative input stress coupling of the electrode pattern of FIG. 11d for the same three modes as FIGS. 11a-c with a different resonator geometry.

FIG. 13 is an isometric view of another embodiment of a resonator according to the invention.

FIG. 14 illustrates another embodiment of a resonator according to the invention.

As illustrated in FIGS. 5–7, a quartz crystal resonator designed in accordance with the invention is designated generally by the reference numeral 22. This resonator includes a quartz crystal body 24 which preferably is integrally formed as a single unit and has a Z-cut crystal orientation in which the z-axis of the crystal is normal to the plane in which the tines are formed. Body 24 has a pair of longitudinally spaced apart end portions 26 and a pair of laterally spaced apart tines 28 extending lengthwise between and formed integrally with the end portions, with the tines being parallel to the y-axis of the crystal. Each of the tines 28 has two inflection points 30, that is, points along its length where the second derivative of lateral displacement with respect to length changes in polarity in the fundamental mode of vibration.

Resonator 22 also includes a set of three electrodes mounted lengthwise in adjacent end-to-end relationship on each lengthwise surface of each tine 28, with two sets of such electrodes 32a-c and 34a-c being shown in FIG. 5 on adjacent surfaces of the adjacent tines. Some, but not all, of the other electrodes are illustrated in FIGS. 6 and 7. Tines 28 are caused to oscillate in their fundamental modes in the manner shown in FIG. 1 and 180° out of phase with one another by energizing all of the electrodes 32a-c and 34a-c, and so on, with AC voltages which are applied to the electrodes of each set with alternating polarities in a predetermined way. Specifically as illustrated in FIG. 5, at any given instant in time, end electrodes 32a and 32c are of one polarity, for example positive, while center electrode 32b is of the opposite polarity, for example negative. At the same instant in time, end electrodes 34a and 34c are energized with an opposite polarity to electrodes 32a and 32c, and center electrode 34b is opposite in polarity to center electrode 32b. This arrangement of alternating polarities is consistent throughout the arrangement of all of the electrodes, as illustrated in FIGS. 6 and 7. The electrodes may be energized by means of a single AC voltage source or oscillator as indicated generally at 36 and requires only two leads. However, in order to use a single source, all of the electrodes which are to be of the same polarity, for example positive, at any given instant are connected together by suitable, relatively thin, electrically conductive lead lines, while the electrodes which are to be of the opposite polarity, for example negative, are connected together in the same way. An example of electrodes interconnected in this way is illustrated in U.S. Pat. No. 4,469,979.

The pattern of electrodes shown in FIG. 5 is suitable for coupling x-axis, or lateral, vibrations in quartz tines. To couple y-axis vibrations in Z-cut quartz, or with other cuts of quartz or other types of crystals with different piezoelectric coupling matrices, the electrodes may need to be positioned differently in order to produce the desired modes of vibration.

As in the case of the prior art resonator illustrated in FIG. 1, tines 28 oscillate 180° out of phase with one another in the plane of the paper as viewed in FIG. 5. However, the electrodes on tines 28 are positioned relative to one another and to inflection points 30 so that tines 28 oscillate substantially only in their fundamental mode and do not oscillate in any significant way in the overtone modes.

As best illustrated in FIG. 5, each of the center electrodes 32b and 34b extends well beyond inflection points 30, with the distance between the inflection points and the midpoints of the gaps between the adjacent ends of the center and end electrodes being designated D and the distance or gap between the adjacent ends being designated E. This arrangement is to be contrasted with the arrangement of the FIG. 1 where the gaps between the adjacent ends of electrodes 18 and 20 coincide with inflection points 16. In the case of resonator 22, the electrodes on each surface of each tine 28 are arranged in a similar manner, with the midpoint between the electrodes being displaced from the inflection points by substantially the distance D and the adjacent ends of the center and end electrodes being separated by the distance E.

It has been found that there is a unique distance D which, when selected, causes the tines 28 to oscillate substantially only in their fundamental mode when the electrodes are energized in the manner described above. In particular, the third mode may be largely suppressed. This distance D will vary from resonator to resonator, depending upon the overall design of the resonator, specifically the tine length, width, and height. If the distance selected is either less than or greater than the distance D, energization of the electrodes will result in less than full suppression of the third mode and possible oscillation in that mode when the resonator is driven by an oscillator.

It has also been found that oscillation in other modes can be selectively enhanced or suppressed by adjusting different parameters of the electrodes, e.g. the width of the gap between the adjacent ends of the central and outer electrodes, the endpoints of the central electrode, and the inner and outer endpoints of the outer electrodes. Such adjustments can be made either symmetrically or asymmetrically in a particular application, and they can be made in a given set of electrodes independently of other sets. These additional degrees of freedom make it possible to enhance or suppress any desired modes, either fundamental or overtone.

Thus, for example, it has been found that there is a unique distance or gap E between the electrodes where oscillations of the fifth mode are further reduced. As in the case of the distance D, the distance E will vary from resonator to resonator, depending on factors such as the overall design of the resonator and the length, width and thickness of the tines.

The relationship between the distances D and E and the oscillation of a tine 39 in the fundamental, third and fifth modes is illustrated somewhat schematically in FIG. 8. In this figure, the inflection points are designated by the reference numeral 41, the central and end electrodes on one side of the tine are designated by the reference numerals 42, 43, and the midpoints of the gaps E between the adjacent ends of the electrodes are designated by the reference numeral 44.

In one presently preferred method of tuning to enhance oscillation in the fundamental mode and suppress oscillation in the third and fifth modes, the distances D and E are adjusted alternately until the desired degree of enhancement and suppression is obtained. In other applications, however, it may be sufficient to first select the distance D to eliminate oscillations of the third mode and to reduce oscillations of higher overtone modes, and thereafter adjust the separation E between the electrodes to further reduce oscillations of the fifth mode, as illustrated in FIG. 8.

The even modes of a double ended tine are poorly coupled to the electrodes because of the odd electrode symmetry about the midpoint of the tine and are seldom troublesome. Two tines are preferred over one in that forces from each of the two tines acting on the end portions 26 from the odd modes nearly cancel, and little energy from the oscillation is lost to the external structure. This makes odd modes higher in their quality factor and improves their transmissibility. Therefore, the selected mode in a double ended resonator is nearly always one of the odd modes, and the electrode patterns are adjusted, as described, to decrease the coupling of the other, unwanted odd modes. If for some reason, the odd electrode symmetry is not used, e.g. when the selected mode is an even mode, the parameters of one or more electrodes may still be adjusted to enhance the desired mode and suppress unwanted modes.

It should be noted that, unlike some prior art resonators in which transmissibility of the desired mode is maximized, in the preferred embodiment of the present invention, what is maximized is the ratio of the transmissibilities of the desired mode and one or more undesired modes. This generally results in a somewhat lower transmissibility of the desired mode than in the prior art. However, it has been found that the transmissibility of the unwanted mode(s) can be reduced by a much larger factor than the reduction in the desired mode. In addition, it has been found that these large reductions can be achieved simultaneously for more than one unwanted mode by adjusting more than one parameter of the driving and sensing elements.

From a dynamic point of view, the poles of the resonator transfer function are nominally set by the mechanical geometry and boundary conditions of the resonator. The position of the electrodes has a relatively small effect on the frequency or quality factor of the resonant modes, i.e., the pole locations, particularly if the resonator is made from crystalline quartz with its relatively weak piezoelectric effect. The zeroes of the system, which have as much effect on the overall transmissibility of the resonator as the poles, are, however, highly dependent upon the electrode locations. By adjusting the end points of the electrodes, transmission zeroes can be placed at substantially the same frequency as unwanted lightly damped poles, thus suppressing those modes very significantly.

The invention is also applicable to single ended resonators by adjusting more than one parameter, e.g. by adding additional electrode patterns to get additional degrees of freedom. By adjusting the endpoints at either end of such electrodes and adjusting the gaps between the electrodes, it is possible to enhance or suppress any desired mode or modes in a single ended resonator just as it is in a double ended resonator.

FIG. 9 illustrates enhancement of the fundamental mode and suppression of the second and third modes in a single ended resonator utilizing two degrees of freedom in the electrode parameters. In the embodiment illustrated, electrodes 46, 47 are mounted on one face of one of the tines 48 of the tuning fork, with electrode 46 being positioned toward the base or crotch of the fork and electrode 47 positioned toward the tip of the tine. Similar electrodes are also provided on one or more of the other faces of this tine and on the other tine as well. In this particular example, the distance D' from the crotch of the tuning fork to the midpoint 49 of the gap between the electrodes and the width of the gap E' between the electrodes are adjusted to enhance oscillation in the fundamental mode and to suppress oscillation in the overtone modes. Even though there are no points where the second derivative of lateral displacement actually goes to zero for the fundamental mode in a single ended tuning fork, it is still possible to find distances D' and E' which will excite the fundamental and suppress overtone modes. In the example of FIG. 9, inflection points 51 and 52 are illustrated for the second and third modes, respectively, and it should be noted that the electrodes do not necessarily change polarity on opposite sides of the added gap.

By way of comparison, FIG. 10 illustrates the application of a single electrode 53 having a length F to the face of the tine 54 of a single ended tuning fork as described in U.S. Pat. No. 3,946,257. In contrast to the invention, this approach provides only a single degree of freedom in that the only electrode parameter which can be adjusted to enhance or suppress a given mode of oscillation is the length F of the electrode. This limits the degree of enhancement and suppression which can be provided.

In selecting the different electrode parameters to enhance and suppress certain modes in either a double ended resonator or a single ended resonator, it is sometimes desirable to maximize the ratio between the wanted and unwanted modes, rather than maximizing the absolute conductance or response in the desired mode. In other applications, it may be desirable to operate as close to the maximum response for the desired mode as possible, in which case the adjustment for suppression of the unwanted modes can be stopped at a level which is sufficient for the particular application even though those modes could be suppressed further. The number of unwanted modes, and hence the number of degrees of freedom required, is dependent upon the requirements of a particular application. Once the unwanted modes have been adequately suppressed, less selective electronic filters can suppress any remaining, more distant, modes, if required for the particular application.

FIGS. 11a–c show the relative output charge coupling of electrodes to the first three odd modes of a double ended tine, as a function of the location x and width y of a gap between the electrodes, with the parameters x and y being illustrated in FIG. 11d. These parameters are normalized to the length of the tines, which are assumed to be narrow relative to their length. The locus of possible parameters which give zero coupling for the given mode is indicated, as is the point of maximum coupling. The physically realizable combinations of distance x and gap width y occupy a triangular area 57.

As the midpoint and width of the gap between the electrodes are varied, each of the three modes experiences better or worse output coupling. By looking at the plots for all three modes, it can be seen that if the gap location and width are close to point A, the fundamental mode is relatively well coupled, and the third and fifth modes are virtually completely suppressed. Points which will enhance and suppress other modes can be selected in a similar manner.

It should be pointed out that no prior art technique has selected point A as the optimal point for the operation of a double ended tine. In fact, most prior techniques have selected a point closer to point B, which give the greatest coupling for the fundamental mode, but, as can be seen in FIGS. 11b and 11c, also couples significant charge from the third and fifth modes.

FIGS. 12a–c show the relative input stress coupling of the electrode pattern of FIG. 11d for the same three modes as FIGS. 11a–c. Strong input coupling for a given mode means that a large motion will occur in that mode when an excitation voltage is applied. Strong output coupling means that a net charge will be collected on the electrodes given an applied motion. If either the input coupling or the output coupling is zero for a mode, the transmissibility of the resonator will be suppressed for that mode.

FIGS. 12a–c are based upon the results of numerous finite element analysis simulations. These simulations utilized realistic width and thickness dimensions for the tine and took into account the isotropic mechanical and electrical properties of piezoelectric quartz. Simulations were done for driving voltages at each of the three mode frequencies, and the output was taken as the maximum lateral displacement.

A quartz crystal resonator having the parameters of point C has been constructed and has indeed been found to have greatly reduced coupling to the unwanted modes, with no tendency to oscillate at any mode other than the desired fundamental mode when driven by an oscillator. The electrode parameters can be optimized with conventional optimization techniques, such as Powell's method, in which an objective cost function such as the inverse ratio of transmissibility in the fundamental mode to transmissibility in overtone modes is formulated in terms of the electrode parameters and minimized. Closed form equations or numerical methods such as finite element analysis can be used to evaluate the input or output coupling of different electrode parameters.

FIG. 13 illustrates a double ended tine 56 with separate driving and pick-up elements in the form of piezoelectric crystals 57, 58 bonded thereto. Elements of this type are commonly referred to as bender beams, and the parameters which can be adjusted to enhance and desired modes of vibration in the tine include the length and position of the two transducers. If the two elements do not interact very much, as may be the case as illustrated, they may be adjusted to suppress unwanted modes more or less independently of each other. For example, the driving transducer may be designed to couple into the fundamental mode and to suppress the fifth mode, and the pick-up transducer may be designed independently to also couple to the fundamental mode but to suppress the third mode. In contrast, in the resonator of FIG. 8 when the dimensions D and E are adjusted, the zeroes near the third and fifth modes interact to a somewhat greater extent.

In the embodiment of FIG. 14, the resonator has an electrode pattern similar to that of FIG. 5, but with electrostatic excitation instead of piezoelectric. In this particular example, two sets of electrodes 59a–c and 60a–c are mounted on opposite sides of a tine 60. In addition, electrodes 63, 64 are mounted on the case of the resonator in facing relationship with the electrodes on the tine. By applying large symmetrical positive and negative bias voltages V+ and V− to electrodes 63, 64, the force applied to the tine is linearized, as is well known in the art of electrostatic drivers or forcers. Sensing is done with the same electrodes, utilizing a very high frequency AM or FM capacitive pick-off method. The driving and sensing signals can be multiplexed into the electrodes, if desired, by taking advantage of the difference in frequency between them.

The optimized electrode pattern will differ from that of FIG. 5, however, since the driving and sensing relationships are different in the two embodiments. For example, the charge collection in an electrode on a piezoelectric crystal is related to the curvature of the tine, i.e. the internal strain of the tine, whereas for a capacitive pick-up, the output signal is proportional to the lateral displacement of the tine.

Overall, the resonator of the invention is especially suitable for use as part of an accelerometer or a force transducer, which can for example be of the type described in U.S. Pat. No. 4,856,350. In addition, it is to be understood that the present invention is not limited to resonators having two tines. It is equally applicable to resonators having a single tine and to resonators having more than two tines, e.g. a balanced H structure.

It is apparent from the foregoing that a new and improved single mode resonator and method have been provided. While only certain presently preferred embodiments have been described in detail, as will be apparent to those familiar with the art, certain changes and modifications can be made without departing from the scope of the invention as defined by the following claims.

We claim:

1. In a quartz crystal resonator displaying a Z-cut crystal orientation and including opposite end portions, a pair of laterally spaced apart tines extending lengthwise between and integrally formed with said end portions, each of said tines displaying two points along its length where the second derivative of its lateral displacement with respect to length changes polarity, and a set of three of electrodes including a center electrode and a pair of end electrodes mounted lengthwise in adjacent end-to-end relationship to one another on each one of selected surfaces of said tines so as to cause said tines to oscillate in their fundamental modes upon energizing said electrodes with AC voltage which is applied to the electrodes of each set with alternating polarity, the improvement wherein:

the center electrode in each set extends beyond the two points where the second derivative changes polarity to locations selected so that each tine oscillates substantially only in its fundamental mode and oscillation in any overtone modes is minimized.

2. The resonator of claim 1 wherein adjacent ends of the center and end electrodes in each set are spaced apart by a distance which minimizes oscillation in at least one overtone mode.

3. The resonator of claim 1 wherein each tine has a rectangular cross-section and four lengthwise surfaces, and each surface of each tine has one of said sets of electrodes mounted thereon.

4. In a quartz crystal resonator displaying a Z-cut crystal orientation and including opposite end portions, at least one tine extending lengthwise between and connected with said end portions, said tine displaying two points along its length where the second derivative of its lateral displacement with respect to length changes polarity, and a set of three electrodes including a center electrode and a pair of end electrodes mounted lengthwise in adjacent end-to-end relationship to one another on each one of selected surfaces of said tine so as to cause said tine to oscillate in its fundamental mode upon energization of said electrodes with AC voltage which is applied to the electrodes of each set with alternating polarity, the improvement wherein:

the center electrode in each set extends beyond the two points where the second derivative changes polarity to locations selected so that the tine oscillates in its fundamental mode while eliminating or at least minimizing oscillation of the tine in any overtone modes.

5. The resonator of claim 4 wherein adjacent ends of the center and end electrodes in each set are spaced apart by a distance which minimizes oscillation in at least one overtone mode.

6. The resonator of claim 4 wherein the tine has a rectangular cross-section and four lengthwise surfaces, and each surface of the tine has one of said sets of electrodes mounted thereon.

7. The resonator of claim 4 wherein the quartz crystal resonator includes a second tine laterally spaced from the first mentioned tine and extending lengthwise between the end portions of the resonator.

8. A quartz crystal resonator, comprising a pair of opposite end portions, at least one tine extending lengthwise between and connected with said end portions, said tine having two points along its length where the second derivative of lateral displacement with respect to length changes polarity, a pair of end electrodes mounted on the tine toward opposite ends thereof, and a center electrode mounted on the tine between the end electrodes and extending well beyond the points where the second derivative changes polarity to locations selected so that the tine oscillates substantially only in its fundamental mode with substantially no oscillation in any overtone modes when an AC voltage is applied to the electrodes.

9. The resonator of claim 8 wherein adjacent ends of the center and end electrodes in each set are spaced apart by a distance which minimizes oscillation in at least one overtone mode.

10. The resonator of claim 8 wherein the tine has a rectangular cross-section with four generally planar surfaces extending lengthwise of the tine, and a like set of the end and center electrodes is mounted on each of the four surfaces.

11. The resonator of claim 10 including a second tine spaced from and generally parallel to the first named tine, with electrodes similar to the electrodes on the first named tine mounted on the second tine.

* * * * *